(12) United States Patent
Zheng et al.

(10) Patent No.: US 7,449,790 B2
(45) Date of Patent: Nov. 11, 2008

(54) METHODS AND SYSTEMS OF ENHANCING STEPPER ALIGNMENT SIGNALS AND METROLOGY ALIGNMENT TARGET SIGNALS

(75) Inventors: Yi Zheng, San Ramon, CA (US); Howard Zolla, San Jose, CA (US); Nian-Xiang Sun, Sunnyvale, CA (US); Hamid Balamane, Palo Alto, CA (US)

(73) Assignee: Hitachi Global Storage Technologies, Inc. (NL)

( * ) Notice: Subject to any disclaimer, the term of this patent is extended or adjusted under 35 U.S.C. 154(b) by 224 days.

(21) Appl. No.: 10/928,466

(22) Filed: Aug. 26, 2004

(65) Prior Publication Data

US 2006/0043615 A1 Mar. 2, 2006

(51) Int. Cl.
*H01L 23/544* (2006.01)
(52) U.S. Cl. .......................... 257/797; 438/401
(58) Field of Classification Search ................ 257/797, 257/622, 762, 770; 438/401
See application file for complete search history.

(56) References Cited

U.S. PATENT DOCUMENTS

| 5,869,383 | A |   | 2/1999  | Chien et al. ............. 438/401 |
| 5,904,563 | A |   | 5/1999  | Yu ............................ 438/672 |
| 6,004,473 | A | * | 12/1999 | Hsiao et al. ............. 216/22 |
| 6,028,750 | A | * | 2/2000  | Ohtsubo ................. 360/126 |
| 6,054,361 | A |   | 4/2000  | Tan et al. ............... 438/401 |
| 6,076,252 | A |   | 6/2000  | Sasaki .................... 29/603.1 |
| 6,242,816 | B1 |   | 6/2001 | Stanton et al. ........... 257/797 |
| 6,248,484 | B1 | * | 6/2001 | Sajan et al. ............. 430/22 |
| 6,259,585 | B1 |   | 7/2001 | Sasaki et al. ............ 360/317 |
| 6,271,602 | B1 | * | 8/2001 | Ackmann et al. ....... 257/797 |
| 6,399,285 | B1 |   | 6/2002 | Kamijima ............... 430/313 |
| 6,420,791 | B1 | * | 7/2002 | Huang et al. ........... 257/797 |
| 6,451,668 | B1 |   | 9/2002 | Neumeier et al. ....... 438/401 |
| 6,888,260 | B2 | * | 5/2005 | Carpi et al. ............. 257/797 |
| 2002/0025588 | A1 | * | 2/2002 | Shiraishi ................. 438/16 |
| 2002/0192926 | A1 |   | 12/2002 | Scroeder et al. ........ 438/401 |
| 2003/0071369 | A1 | * | 4/2003 | Huang et al. ........... 257/797 |
| 2003/0127751 | A1 | * | 7/2003 | Yamada et al. ......... 257/797 |

FOREIGN PATENT DOCUMENTS

| JP | 1030220    | 2/1989  |
| JP | 1117027    | 5/1989  |
| JP | 1206347    | 8/1989  |
| JP | 5143932    | 6/1993  |
| JP | 7176018    | 7/1995  |
| JP | 8203029    | 8/1996  |
| JP | 10133397   | 5/1998  |
| JP | 10162316   | 6/1998  |
| JP | 2000173018 | 6/2000  |
| JP | 2002367111 | 12/2002 |
| JP | 2003140366 | 5/2003  |

* cited by examiner

Primary Examiner—Tuan H Nguyen

(57) ABSTRACT

Methods and systems of enhancing stepper alignment signals and metrology alignment target signals. In one embodiment, a plurality of alternating rows comprising a first material of a first height and a second material of a second height are constructed. The first material and the second material are selected to enhance the contrast of the mark when imaged for alignment of photolithographic structures.

9 Claims, 6 Drawing Sheets

METHODS AND SYSTEMS OF ENHANCING STEPPER ALIGNMENT SIGNALS AND METROLOGY ALIGNMENT TARGET SIGNALS

FIELD OF THE INVENTION

Embodiments in accordance with the present invention relate to the alignment of masks used in photolithographic manufacturing processes.

BACKGROUND

A disk storage system, such as a magnetic hard disk drive (HDD), uses one or more disks or "platters" as a data recording medium. The HDD records data on the disk by use of a magnetic recording head which can also reproduce data from the disk.

Increased levels of storage capacity in hard disk drives are the result of many improvements in a variety of areas, including, for example, finer head positioning, smaller read/write heads, and perpendicular recording.

An important factor in increasing storage capacity is to decrease the size of the recording (and reading) head. Such heads typically comprise multiple layers of various materials produced by photolithographic manufacturing processes, in a manner similar to those processes utilized to produce integrated circuits.

In a typical photolithographic manufacturing process, light energy is transmitted through a mask that defines particular features for a layer of the structure under construction. A typical process can include dozens of masks, which are utilized in a particular sequence. A "stepper" places each mask in sequence over the structure. Aligning the multiple individual masks is a very critical operation in such processes.

Conventional mask alignment processes utilize fiducial marks produced in a first layer to align a subsequent mask. For example, such a conventional fiducial mark comprises a periodic grating structure of varying, for example, two, heights. For alignment purposes, such a fiducial mark is illuminated by a laser to produce a diffraction pattern that is used to guide a stepper to place a next mask into proper position. A typical specification for depth of such a fiducial grating mark is that the relieved "groves" should be approximately 100 nm deep. Grooves of much less than 100 nm in depth typically do not produce sufficient pattern energy to align the mask with sufficient accuracy.

Unfortunately, it is desirable to construct magnetic read/write heads with some layers, e.g., a sensor or "read" layer, of significantly less thickness. For example, a desirable thin sensor layer is approximately 20 to 40 nm. A conventional fiducial grating mark of about 100 nm thick is unsuited to use in such a thin sensor layer.

A conventional art approach utilized to overcome the limited depth available in thin layers, e.g., layers substantially thinner than a recommended fiducial grating mark depth, is to align subsequent layers to other layers that are thick enough to accommodate a recommended fiducial grating mark depth. Unfortunately, aligning to such other layers can lead to a deleterious build up of alignment tolerances. For example, thin layer B, aligned with a mark on layer A, is produced at a maximum acceptable misalignment in a particular direction with respect to layer A. Layer C, disposed adjacent to thin layer B, is also aligned to a mark on layer A, as thin layer B is unsuitable for a conventional alignment mark. Layer C is produced at a maximum acceptable misalignment in the opposite direction with respect to layer A. Consequently, under the conventional art, even though both layers B and C are within acceptable alignment specifications with respect to their alignment targets (on layer A), it is frequently the case that layers B and C exceed acceptable alignment specifications with respect to one another. Poor alignment between layers can, for example, result in poor function of the device and/or substantial yield loss.

SUMMARY OF THE INVENTION

Therefore, methods and systems of enhancing stepper alignment signals and metrology alignment target signals, especially for use with "thin" layers, are highly desired.

Accordingly, methods and systems of enhancing stepper alignment signals and metrology alignment target signals are disclosed. In one embodiment, a plurality of alternating rows comprising a first material of a first height and a second material of a second height are constructed. The first material and the second material are selected to enhance the contrast of the mark when imaged for alignment of photolithographic structures.

In accordance with another embodiment of the present invention, the rows of an alignment mark differ in height by less than about 50 nm.

In accordance with still another embodiment of the present invention, the first material and the second material are characterized in that they have substantially different complex refractive index yielding substantially different reflectivity.

DETAILED DESCRIPTION OF THE INVENTION

In the following detailed description of the present invention, methods and systems of enhancing stepper alignment signals and metrology alignment target signals, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Methods and Systems of Enhancing Stepper Alignment Signals and Metrology Alignment Target Signals Embodiments in accordance with the present invention are herein described in terms of magnetic recording heads for use in disk storage systems, e.g., a magnetic hard disk drive. It is to be appreciated that embodiments in accordance with the present invention are well suited to other devices employing and fabricated via photolithographic manufacturing processes, for example, integrated circuits.

Figure 1:
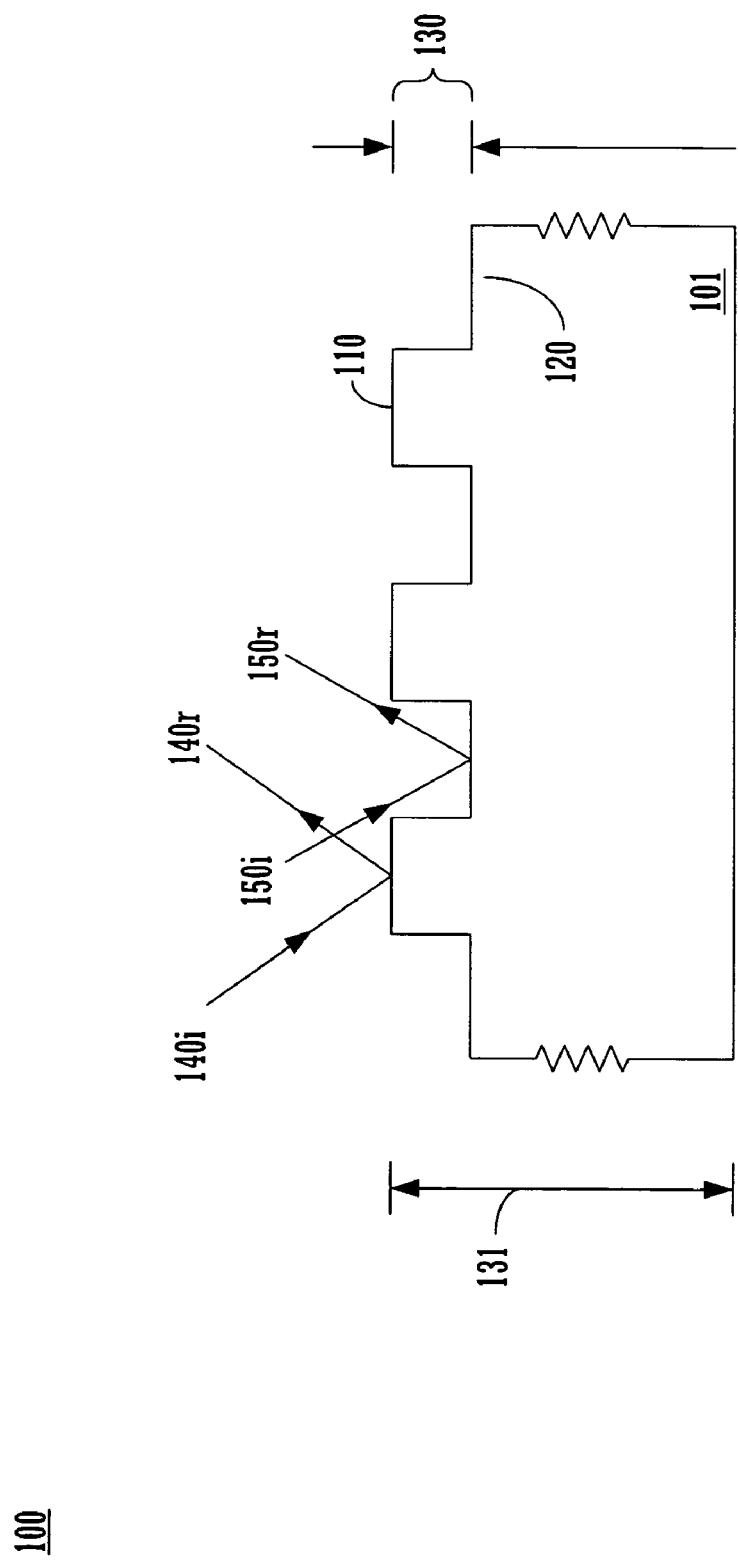
FIG. 1 illustrates a side sectional view of a mask alignment fiducial mark, in accordance with embodiments of the present invention.

FIG. 1 illustrates a side sectional view of mask alignment fiducial mark 100, in accordance with embodiments of the present invention. Mask alignment fiducial mark 100 is typically constructed in a layer of a photolithographic construction, e.g., layer 101 of a magnetic read/write head. It is appreciated that layer 101 generally comprises other features (not shown). It is generally desirable to align such features of layer 101 with features of other layers yet to be created on top of layer 101. More specifically, it is generally desirable to align features of subsequent layers to features of layer 101. A mask alignment fiducial mark is almost always utilized in such alignment processes.

Mask alignment fiducial mark 100 comprises a plurality of rows, e.g., row 110 and row 120, of varying heights. FIG. 1 illustrates a plurality of rows of two different heights. It is to be appreciated that embodiments in accordance with the present invention are well suited to a plurality of rows of a plurality of heights.

Height 130 illustrates a height difference between rows, for example, between row 110 and row 120. Row 110 can, for example, represent a surface of the layer 101 comprising mask alignment fiducial mark 100. Row 120 can, for example, represent a depth into, or relieved from, layer 101. Row 120 can be formed, for example, by removing material from the layer 101. It is to be appreciated that mask alignment fiducial mark 100 can be constructed by other methods, including, for example, adding material to the surface of a layer 101 to create rows above the surface.

Light rays 140$i$ and 150$i$ illustrate light incident onto parts of mask alignment fiducial mark 100. Light rays 140$r$ and 150$r$ illustrate light reflected from parts of mask alignment fiducial mark 100. In many stepper systems, a laser is used to illuminate mask alignment fiducial mark 100, while the reflected light is sensed and utilized to align subsequent masks to the layer 101. For example, the stepper alignment system senses a phase delta between reflected waves 140$r$ and 150$r$. In general, the phase difference between light reflected from a "higher" row and light reflected from a "lower" row corresponds to the strength of an alignment signal. In most cases a stronger alignment signal enables more exacting alignment of subsequent masks to previous structures.

Under the conventional art, height 130 between adjacent rows is usually required to be about 100 nm. If height 130 decreases too far below this level, insufficient alignment signal is generated and alignment is frequently unacceptable.

For thin film magnetic heads, various layers, e.g., a "thin" sensor layer, are desirably significantly thinner than the about 100 nm difference required for conventional alignment marks. For example, a sensor layer can desirably be 20-40 nm thick. Layer 101, as indicated by height 131, is such a "thin" layer, approximately 20-40 nm thick.

It is to be appreciated that desired row height differences of about 100 nm cannot be achieved in cases, such as layer 101, in which the layer thickness is substantially less than the desired height.

In accordance with embodiments of the present invention, alternating rows of mask alignment fiducial mark 100 comprise selected surface treatments to enhance the contrast of mask alignment fiducial mark 100 when imaged by a stepper, as during a mask alignment process. For example, a metal film is applied to the upper surface of "tall" rows, e.g., row 110, and a different metal film is applied to the upper surface or the "lower" rows or wells, e.g., row 120. In accordance with embodiments of the present invention the two different films are selected to produce a mismatch between the complex refractive indexes (n and k values) of the two materials. It is appreciated that one or both rows may be formed from the material, as well as comprising a coating of the material.

For example, copper is characterized in that it has a complex refractive index (n, k) of (0.055, 1.89) for 633 nm (red) light, as is commonly used in stepper equipment for mask alignment. CoFe is characterized in that it has a complex refractive index (n, k) of (2.188, 5.732) for the same wavelength light. As 532 nm (green) light is also commonly used in stepper equipment for mask alignment, it is highly beneficial for the two materials to create a mismatch between the complex refractive index (n and k values) at this wavelength as well. For example, copper is characterized in that it has a complex refractive index (n, k) of (0.73, 1.441) for 532 nm (green) light, and CoFe is characterized in that it has a complex refractive index (n, k) of (1.937, 5) for the same wavelength light.

Other materials can be employed to create such mismatches between complex reflectivities. Various combinations of tantalum, copper, rhodium, CoFe, NiFe, tungsten and gold are well suited to embodiments in accordance with the present invention. For example, rhodium (2.612, 3.277) for 633 nm light, and (2.342, 3.112) for 532 nm light, can be used in place of CoFe in conjunction with copper. While rhodium does not produce quite the mismatch between complex refractive indexes as does CoFe in conjunction with copper, rhodium is more chemically stable than CoFe, and rhodium stands up well to other processing, e.g., Chemical Mechanical Planarization (CMP).

It is to be appreciated that in many, but not all, photolithographic manufacturing processes, an ion mill process produces such alignment marks. In such cases, milling time and milling rate for a particular material determine step height, or the difference between row heights. As a consequence, some materials can be removed to a deeper depth than others, for a given milling time. In general, deeper steps, or the difference between row heights, are more favorable than shallower steps in alignment marks. In accordance with embodiments of the present invention, materials utilized to form an alignment mark can be selected for favorable milling rates. For example, rhodium and copper in general are characterized as having greater milling rates than $Al_2O_3$, NiFe, CoFe or sensor materials.

Figure 2A:
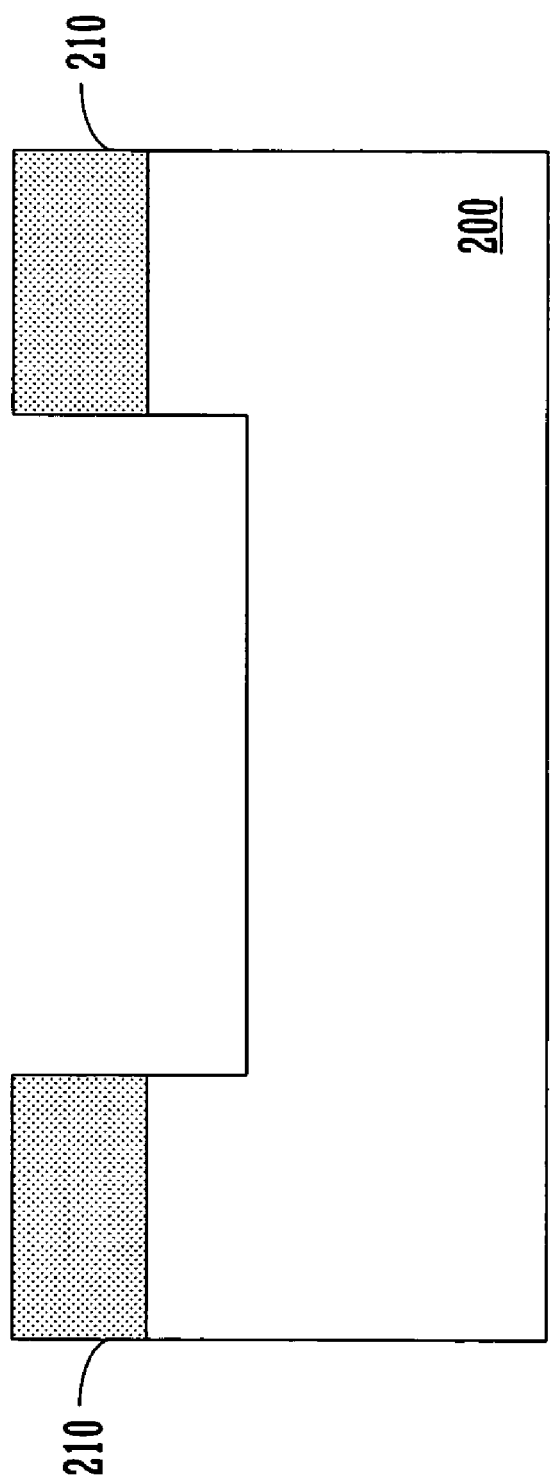
FIGS. 2A, 2B, 2C and 2D illustrate stages used in a method of manufacturing an alignment mark, in accordance with embodiments of the present invention.

FIGS. 2A-2D illustrate stages in a method of manufacturing an alignment mark, in accordance with embodiments of the present invention. FIG. 2A illustrates a side sectional view of layer 210 upon a base layer 200. Layers 210 and 200 can be part of a multi-layer structure such as is common in integrated circuit manufacturing as well as in the production of magnetic read/write heads. For example, layer 200 can be a "shield" layer of a magnetic head structure. Layer 210 can be a thin "sensor" layer of such a head structure. It is appreciated that, in general, other layers of a variety of materials may be adjacent, e.g., above and/or below, layers 200 and 210. Furthermore, embodiments of the present invention are well suited to a structure comprising one or more layers of material between layers 200 and 210, e.g., an alumina "gap" layer.

In FIG. 2A, material of both layers has been removed, for example via an ion milling process, to create a region for an alignment mark. It is appreciated that the material removal has created a hole through layer 210 and a hole or depression into layer 200, forming a mark region.

Figure 2B:
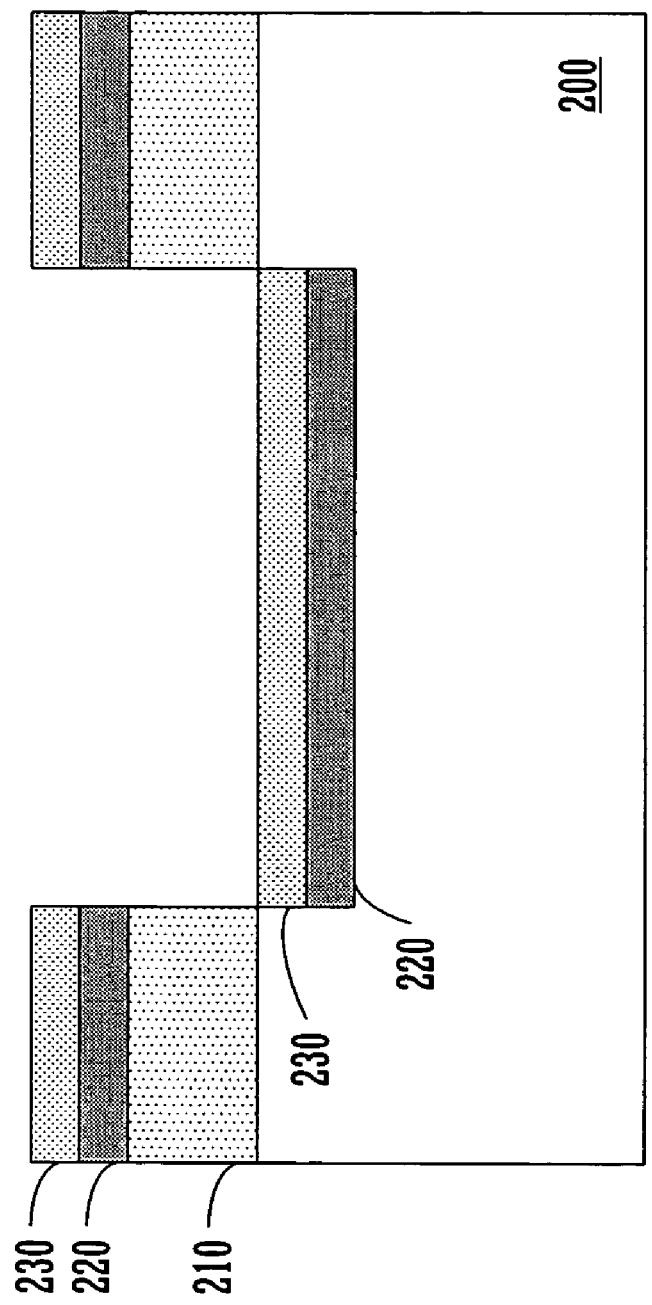

FIG. 2B illustrates the addition of thin metal films to layers 200 and 210. Metal film 220 can be, for example, copper, of about 100 nm in thickness. Metal film 230 can be, for example, rhodium, of about 20 nm thickness. It is appreciated that many metal application processes apply metal to most or all of a wafer. Consequently, the metal films 220 and 230 are shown to overlay both layers 200 and 210, although embodiments in accordance with the present invention are well suited to application of metal only to the mark region.

Figure 2C:
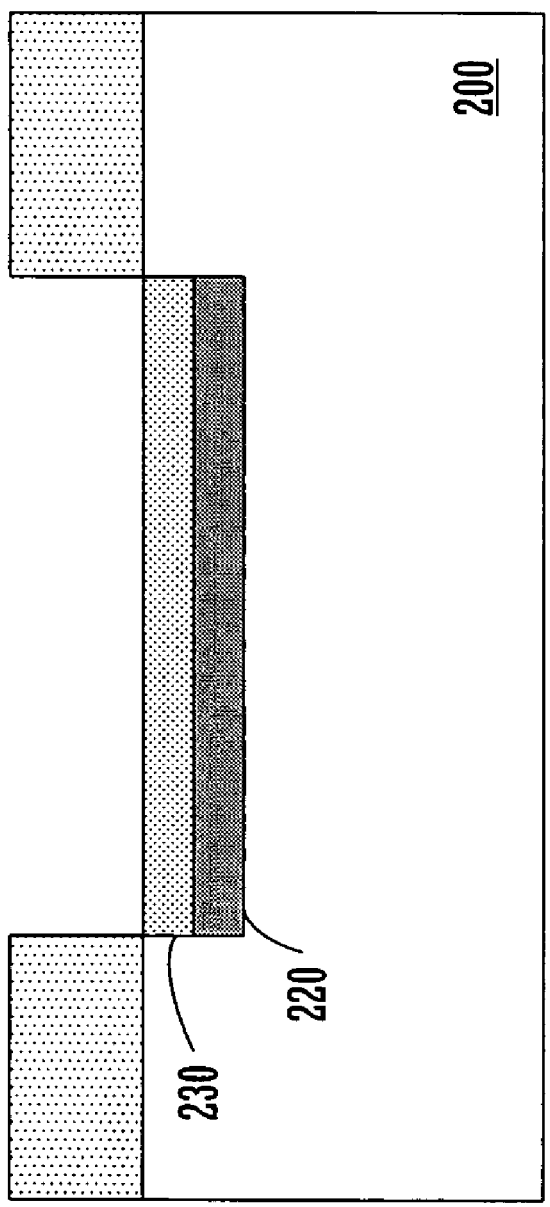

In FIG. 2C, metal films 220 and 230 are removed in regions above layer 210, for example via a lift-off process. It is appreciated that metal films 220 and 230 remain above layer 200, within the mark region.

Figure 2D:
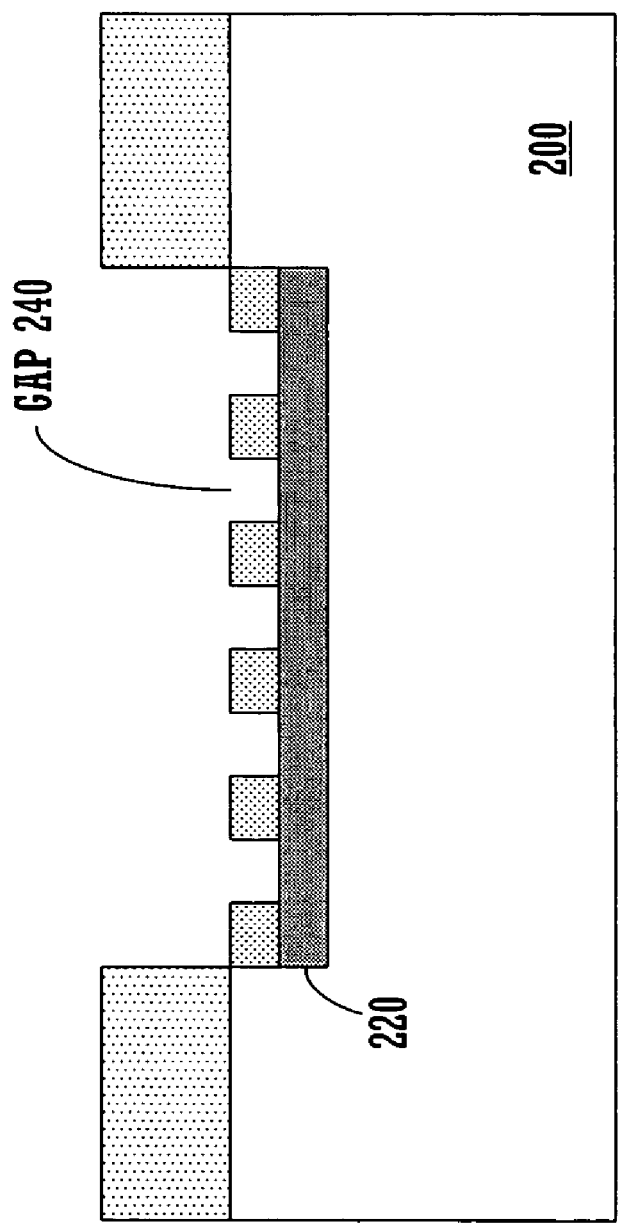

In FIG. 2D, portions of metal film 230 to create gaps, e.g., gap 240, within layer 230. Such gaps create rows of differing heights similar to those depicted in FIG. 1. The finished structure of FIG. 2D can be used as an alignment mark.

Figure 3:
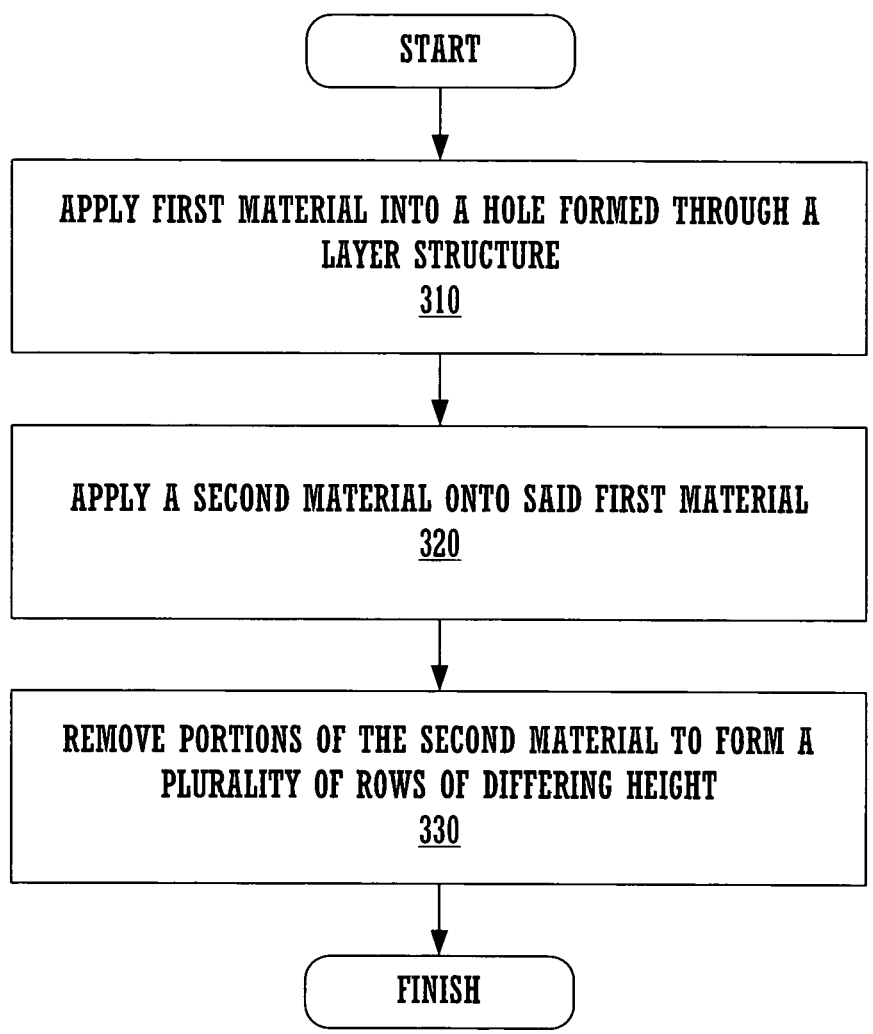
FIG. 3 is a flow chart of a method of manufacturing an alignment mark, in accordance with embodiments of the present invention.

FIG. 3 is a flow chart of a method 300 of manufacturing an alignment mark, in accordance with embodiments of the present invention. In block 310, a first material is applied into a hole formed through a layer structure. It is appreciated that the hole can be through and/or into multiple layers of a multi-layer structure. The layer structure can be a thin layer, e.g., significantly less than about 100 nm, that is unsuitable for a conventional alignment mark. The first material can be, for example, copper, applied to a thickness of about 100 nm.

In block 320, a second material is applied onto the first material. The second material can be, for example, rhodium, applied to a thickness of less than about 50 nm. The first and second materials can be of the group comprising tantalum, copper, rhodium, CoFe, NiFe, tungsten and gold.

In block 330, portions of the second material are removed to form a plurality of rows of differing height. For example, "tall" rows substantially comprise the second material, while "deep" rows or grooves are formed when the second material has been removed. The first material and the second material are selected to enhance the contrast of the alignment mark.

Embodiments in accordance with the present invention, methods and systems of enhancing stepper alignment signals and metrology alignment target signals, are thus described. While the present invention has been described in particular embodiments, it should be appreciated that the present invention should not be construed as limited by such embodiments, but rather construed according to the below claims.

What is claimed is:

1. A mark structure for aligning photolithographic masks comprising:
   a plurality of alternating rows comprising a first material of a first height and a second material of a second height, wherein said first material and said second material are selected to enhance the contrast of said mark structure when imaged for alignment of photolithographic structures wherein said second material is CoFe.

2. The mark structure of claim 1 wherein said first height and said second height differ by less than 50 nm.

3. The mark structure of claim 1 wherein said first material is a metal film.

4. The mark structure of claim 1 wherein said first material and said second material are characterized as having substantially different complex refractive indexes.

5. The mark structure of claim 1 wherein said first material is copper.

6. The mark structure of claim 1 embodied in a magnetic recording head.

7. The mark structure of claim 6 embodied in a disk drive.

8. The mark structure of claim 1 wherein said first material is of the group comprising tantalum, copper, rhodium, CoFe, NiFe, tungsten, and gold.

9. The mark structure of claim 1 wherein said first and said second material are characterized as having a high milling rate.

* * * * *